(12) United States Patent
Hong et al.

(10) Patent No.: US 10,808,321 B2
(45) Date of Patent: *Oct. 20, 2020

(54) GRAPHENE ROLL-TO-ROLL COATING APPARATUS AND GRAPHENE ROLL-TO-ROLL COATING METHOD USING THE SAME

(71) Applicant: Graphene Square Inc., Seoul (KR)

(72) Inventors: Byung Hee Hong, Seoul (KR); Young Jin Kim, Seoul (KR); Jaeboong Choi, Yongin-si (KR); Hyeong Keun Kim, Hwaseong-si (KR); Junmo Kang, Suwon-si (KR); Su Kang Bae, Suwon-si (KR)

(73) Assignee: Graphene Square Inc., Seoul (KR)

( * ) Notice: Subject to any disclaimer, the term of this patent is extended or adjusted under 35 U.S.C. 154(b) by 81 days.

This patent is subject to a terminal disclaimer.

(21) Appl. No.: 15/926,473

(22) Filed: Mar. 20, 2018

(65) Prior Publication Data

US 2018/0209044 A1 Jul. 26, 2018

Related U.S. Application Data

(62) Division of application No. 14/462,178, filed on Aug. 18, 2014, now Pat. No. 10,266,948, which is a
(Continued)

(30) Foreign Application Priority Data

Feb. 8, 2010 (KR) .......................... 10-2010-0011437

(51) Int. Cl.
*C23C 16/54* (2006.01)
*H01J 37/32* (2006.01)
(Continued)

(52) U.S. Cl.
CPC ........ *C23C 16/545* (2013.01); *C23C 16/0281* (2013.01); *C23C 16/26* (2013.01);
(Continued)

(58) Field of Classification Search
None
See application file for complete search history.

(56) References Cited

U.S. PATENT DOCUMENTS 10,266,948 B2 * 4/2019 Hong ..................... C23C 16/26
2006/0099359 A1 5/2006 Hiss
(Continued)

FOREIGN PATENT DOCUMENTS

GB 2458776 B 6/2010
JP 63014554 U 1/1988
(Continued)

OTHER PUBLICATIONS

M. Jacoby: "Big graphene", Chemical & Engineering News, [Online] vol. 88, No. 27, Jul. 5, 2009 (Jul. 5, 2009), p. 31, Retrieved from the Internet: URL:http ://pubs.acs.org/cen/science/88/8827 sci3. html.
(Continued)

*Primary Examiner* — Karla A Moore
(74) *Attorney, Agent, or Firm* — Greer Burns & Crain, Ltd.

(57) ABSTRACT

A graphene roll-to-roll coating apparatus and a graphene roll-to-roll coating method are provided on the basis of a continuous process.

16 Claims, 19 Drawing Sheets

Related U.S. Application Data division of application No. 12/909,352, filed on Oct. 21, 2010, now abandoned.

(51) Int. Cl.
    *C23C 16/56*     (2006.01)
    *C23C 16/26*     (2006.01)
    *C23C 16/02*     (2006.01)
    *C23C 16/46*     (2006.01)

(52) U.S. Cl.
    CPC ............ *C23C 16/463* (2013.01); *C23C 16/56* (2013.01); *H01J 37/3277* (2013.01); *H01J 37/32899* (2013.01); *Y10T 428/13* (2015.01); *Y10T 428/31678* (2015.04)

(56) References Cited

U.S. PATENT DOCUMENTS

| | | | |
|---|---|---|---|
| 2008/0178924 A1 | 7/2008 | Kempa et al. | |
| 2009/0081383 A1 | 3/2009 | Alberding et al. | |
| 2010/0140756 A1 | 6/2010 | Kozasa et al. | |
| 2010/0260933 A1 | 10/2010 | Malecki et al. | |
| 2012/0094149 A1* | 4/2012 | Lee ....................... | C23C 16/403 428/701 |

FOREIGN PATENT DOCUMENTS

| | | |
|---|---|---|
| JP | 2008050228 A | 3/2008 |
| KR | 1020090026568 A | 3/2009 |
| WO | 2008078516 A1 | 7/2008 |
| WO | 1009119641 A1 | 10/2009 |
| WO | 2009122139 A1 | 10/2009 |

OTHER PUBLICATIONS

Sukang Bae et al.: "30 inch Roll-Based Production of High-Quality Graphene Films for Flexible Transparent Electrodes", Science and Technology, [Online] vol. 5, No. 8, Dec. 12, 2009 (Dec. 12, 2009), Retrieved from the Internet: URL :http://www. mendeley .com/research/30inch-rollbased-productionhighquality-graphene-films-flexible-transparent-electrodes/.

Xuesong Li et al: "Large-area synthesis of high-quality and uniform graphene films on copper foils", Science, American Association for the Advancement of Science, Washington, DC; US, vol. 324, No. 5932, Jun. 5, 2009 (Jun. 5, 2009), pp. 1312-1314, XP008127 472, ISSN: 0036-8075, DOI: DOI:10.1126/Science.1171245 [retrieved on May 7, 2009].

Reina A et al: "Large area, few-layer grapherie films on arbitrary substrates by chemical vapor deposition", Nano Letters, ACS, Washington, DC, US, vol. 9, No. 1, Jan. 1, 2008 (Jan. 1, 2008), pp. 30-35, XP008127442, ISSN: 1530-6984, DOI: DOI:10 1021/NL801827V [retrieved on Dec. 11, 2008].

Hopfe V et al: "Linear Extended Arcjet-CVS—a New PECVD Approach for Continuous Wide Area Coating Under Atmospheric Pressure", Chemical Vapor Deposition, Wiley-VCH Verlag, Weinheim, DE, vol. 11, Jan. 1, 2005 (Jan. 1, 2005), pp. 510-522, XP001501983, ISSN: 0948-1907, DOI: 001:10.1002/CVOE.200406343.

EP Search Report for EP Patent Application No. EP10188333, dated Apr. 20, 201, 9 pages.

\* cited by examiner

Water based heat-pipe  Air based heat-pipe

GRAPHENE ROLL-TO-ROLL COATING APPARATUS AND GRAPHENE ROLL-TO-ROLL COATING METHOD USING THE SAME

This is a divisional of application Ser. No. 14/462,178 filed Aug. 18, 2014, which is a divisional of application Ser. No. 12/909,352 filed Oct. 21, 2010.

CROSS-REFERENCE TO RELATED APPLICATION

This application claims the benefit of Korean Patent Application No. 10-2010-0011437 filed on Feb. 8, 2010, the entire disclosures of which are incorporated herein by reference.

FIELD OF THE INVENTION

The present disclosure relates to a graphene roll-to-roll coating apparatus, a graphene roll-to-roll coating method using the same, and a metallic member coated with graphene.

BACKGROUND OF THE INVENTION

A metallic pipe or a metallic plate has wide application in the industry. Especially, a metallic pipe or a metallic plate may be used as a heat pipe or a heat plate. The heat pipe is a pipe for transferring heat efficiently, and its main body may be made of copper, stainless steel, ceramics, tungsten, or the like while its inner wall may be made of a porous fiber. Further, a material such as methanol, acetone, water or mercury may be used as a volatile material in the inside of the heat pipe.

By way of example, the heat pipe may be used in a waste heat collecting device, an air conditioning and cooling system, a solar energy collector, a cooling system of an atomic reactor, and so forth, and also be used for cooling an electronic component and device, for cooling an electric motor, for local heating and heat control, for heat control of a satellite, a flying vehicle, cooling systems and so forth.

In its wide application examples, the heat pipe exhibits many advantages in that it is capable of transferring high-density heat effectively while reducing power consumption and weight and volume of an apparatus.

Recently, there has been an increasing demand for a heat pipe domestically considering energy reduction, development and usage of alternative energy, and the necessity for cooling and reducing the size of electronic appliances and electric devices.

In this regard, there has been a demand for a method for manufacturing a heat pipe having high heat transfer efficiency and high reliability with low cost by processing a surface of a metallic member such as a metallic pipe or a metallic plate to use it as a heat pipe or a heat plate. For the purpose, using a method for improving heat transfer efficiency and reliability by coating a surface of a metallic pipe or a metallic plate with such a material as graphene has yet to be reported, and, besides, a continuous process for coating the graphene on the surface of the metallic pipe or the metallic plate and an apparatus therefor have yet to be reported, either.

BRIEF SUMMARY OF THE INVENTION

The present disclosure provides a graphene roll-to-roll coating apparatus based on a roll-to-roll coating technique as a continuous process and also provides a method for coating a metallic member with graphene by using the graphene roll-to-roll coating apparatus. However, it should be noted that the problems to be solved by the present disclosure is not limited to the aforementioned problems, and other problems can be clearly understood by those skilled in the art from the following description.

In accordance with one aspect of the present disclosure, there is provided a graphene roll-to-roll coating apparatus, including:

a first roller that supplies a metallic member in a roll-to-roll manner;

a pre-treating unit that performs a surface treatment on the supplied metallic member;

a graphene forming unit that forms and simultaneously coats graphene on a surface of the pretreated metallic member; and a second roller that collects the metallic member coated with the graphene in a roll-to-roll mechanism after the metallic member passes through the graphene forming unit.

In accordance with another aspect of the present disclosure, there is provided a graphene roll-to-roll coating method using the graphene roll-to-roll coating apparatus as described above, the method including:

supplying a metallic member from a first roller to a pre-treating unit in a roll-to-roll manner;

performing a surface treatment on the supplied metallic member in the pre-treating unit;

transferring the metallic member into the graphene forming unit to form and simultaneously to coat graphene on a surface of the pre-treated metallic member; and collecting the metallic member coated with the graphene by a second roller in a roll-to-roll manner after the metallic member passes through the graphene forming unit.

In accordance with still another aspect of the present disclosure, there is provided a metallic member coated with graphene, formed by the graphene roll-to-roll coating method as described above.

The graphene roll-to-roll coating apparatus in accordance with the present disclosure may have a chamber shape or tube shape, and thus, the chamber(s) or the tube(s) are configured to communicate with each other in sequence to perform a stable continuous process. Further, high quality of graphene can be coated on one surface or both surfaces of the metallic member in a large scale with lost cost.

Further, the metallic member of which surface is coated with graphene by using the graphene roll-to-roll coating apparatus of the present disclosure exhibits high anti-chemical/anti-corrosion property, improved liquid resistance, high heat transfer efficiency and highly efficient exothermal (heat dissipating) property.

BRIEF DESCRIPTION OF THE DRAWINGS

Non-limiting and non-exhaustive embodiments will be described in conjunction with the accompanying drawings. Understanding that these drawings depict only several embodiments in accordance with the disclosure and are, therefore, not to be intended to limit its scope, the disclosure will be described with specificity and detail through use of the accompanying drawings, in which.

DETAILED DESCRIPTION OF THE INVENTION

Figure 1:
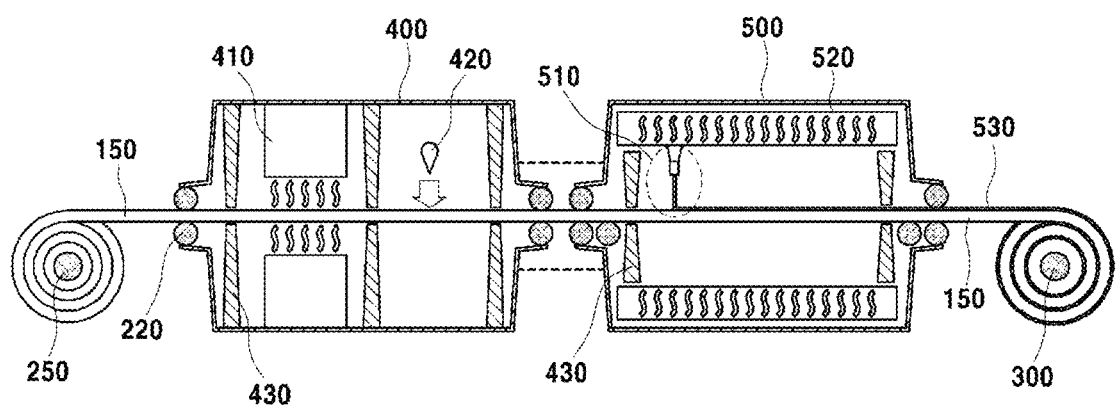
FIG. 1 is a cross sectional view showing a graphene roll-to-roll coating apparatus of a horizontally configured chamber-type in accordance with an embodiment of the present disclosure.

Hereinafter, embodiments and examples of the present disclosure will be described in detail with reference to the accompanying drawings in order for those skilled in the pertinent art to easily implement it.

However, it is to be noted that the present disclosure is not limited to the embodiments and the examples but can be implemented in various other ways. In the drawings, parts irrelevant to the description are omitted for the simplicity of explanation, and like reference numerals denote like parts through the whole document.

Through the whole document, the term "comprises or includes" and/or "comprising or including" used in the document means that one or more other components, steps, operation and/or existence or addition of elements are not excluded from the described components, steps, operation and/or elements but further included unless stated otherwise.

The terms "about or approximately" or "substantially" are intended to have meanings close to numerical values or ranges specified with an allowable error and intended to prevent accurate or absolute numerical values disclosed for understanding of the present invention from being illegally or unfairly used by any unconscionable third party.

The term "graphene" refers to a layer or a sheet made of graphene which is a polycyclic aromatic molecule formed of a multiple number of carbon atoms bonded by a covalent bond. The carbon atoms bonded by the covalent bond may form a 6-membered ring as a basic repeat unit but may further include 5-membered and/or 7-membered rings. Accordingly, the metallic graphene layer may exit as a monolayer of covalently bonded (typically, $sp^2$-bonded) carbon atoms. The metallic graphene layer may have various structures, and their structures may depend on a 5-membered and/or 7-membered ring content that may be included in the graphene. The metallic graphene layer may be a monolayer of graphene as mentioned above, but it may also be made of a plurality of graphene layers stacked together. Typically, the dangling bonds on the edge of the graphene may be saturated with a hydrogen atom.

The term 'metallic member' refers to a member made of a metallic material typically used in the pertinent art. By way of example, the metallic member may include a metallic pipe, a metallic plate, a metal sheet, a metal wire, a metal foil, and the like. There is no special restriction in the shape and/or the structure of the metallic member, and any shape or structure known in the art may be used.

In accordance with one aspect of the present disclosure, there is provided a graphene roll-to-roll coating apparatus, including:

a first roller that supplies a metallic member in a roll-to-roll manner;

a pre-treating unit that performs a surface treatment on the supplied metallic member;

a graphene forming unit that forms and simultaneously coats graphene on a surface of the pretreated metallic member; and a second roller that collects the metallic member coated with the graphene in a roll-to-roll mechanism after the metallic member passes through the graphene forming unit. The graphene roll-to-roll coating apparatus is capable of performing a graphene coating process on the surface of the metallic member by using the above-described apparatus as a post process after intrusion, drawing and rolling processes that are machining processes for the metallic member.

In an exemplary embodiment, the graphene roll-to-roll coating apparatus may further include a cooling unit that cools the graphene-coated metallic member prior to collecting the metallic member coated with the graphene by the second roller, but not limited thereto.

In an exemplary embodiment, the first roller, the pre-treating unit, the graphene forming unit, the cooling unit and the second roller may be vertically or horizontally arranged, but not limited thereto.

In an exemplary embodiment, the pre-treating unit performs, on the surface of the metallic member supplied from the first roller, a process selected from a group consisting of a plasma process, a laser process, pre-heating and a combination thereof, but not limited thereto.

In an exemplary embodiment, the metallic member includes a metallic pipe, a metallic plate, a metallic sheet, a metallic wire or a metallic foil, but not limited thereto.

In an exemplary embodiment, each of the pre-treating unit and the graphene forming unit has a chamber shape, but not limited thereto. For example, the chamber of each of the pre-treating unit and the graphene forming unit has a partition wall, but not limited thereto.

In an exemplary embodiment, the graphene roll-to-roll coating apparatus may further include a roller provided at an inlet and/or an outlet of the pre-treating unit having the chamber shape, but not limited thereto.

In an exemplary embodiment, the graphene roll-to-roll coating apparatus may further include a roller provided at an inlet and/or an outlet of the graphene forming unit having the chamber shape, but not limited thereto.

In an exemplary embodiment, the graphene forming unit having the chamber shape includes one or more gas nozzles, but not limited thereto.

In an exemplary embodiment, the graphene forming unit having the chamber shape includes a temperature controllable heating source, but not limited thereto.

In an exemplary embodiment, the pre-treating unit, the graphene forming unit and the cooling unit have tube shapes and are arrange so as to communicate with each other, but not limited thereto.

In an exemplary embodiment, the graphene roll-to-roll coating apparatus further comprises, but not limited thereto:

a first gas inlet formed between the first roller and the pre-treating unit;

a second gas inlet formed between the pre-treating unit and the graphene forming unit;

a third gas inlet formed between the graphene forming unit and the cooling unit; and a first gas outlet formed between the cooling unit and the second roller.

In an exemplary embodiment, the first roller is provided with a fourth gas inlet for supplying a gas into the inside of the metallic member, and the second roller is provided with a second gas inlet for exiting the gas from the inside of the metallic member, but not limited thereto.

In an exemplary embodiment, each of the pre-treating unit and the graphene forming unit has a temperature controllable heating jacket, and the cooling unit has a temperature controllable cooling jacket, but not limited thereto.

In an exemplary embodiment, the pre-treating unit performs, on the surface of the metallic member supplied from the first roller, a process selected from a group consisting of a plasma process, a laser process, pre-heating and a combination thereof, but not limited thereto.

In an exemplary embodiment, each of the pre-treating unit and the graphene forming unit has a temperature controllable heating jacket, and the cooling unit has a temperature controllable cooling jacket, but not limited thereto.

Hereinafter, illustrative embodiments and examples of a graphene roll-to-roll coating apparatus, a method for roll-to-roll coating a metallic member with graphene and a metallic member coated with graphene will be described in detail with reference to the accompanying drawings. However, it should be noted that the embodiments and examples are for the purposes of illustration and are not intended to limit.

A roll-to-roll coating apparatus 700 in accordance with the present disclosure includes a first roller 250 for supplying a metallic member 150 in a roll-to-roll manner; a pre-treating unit 400 for processing a surface of the supplied metallic member supplied by the first roller 250; a graphene forming unit 500 for forming and coating graphene on a surface of the pre-treated metallic member; and a second roller 300 for collecting the metallic member coated with the graphene in a roll-to-roll manner after the metallic member passes through the graphene forming unit (see FIGS. 1 to 5). In one illustrative embodiment, the graphene roll-to-roll coating apparatus may further include a cooling unit 600 for cooling the metallic member coated with the graphene in the graphene forming unit. From the first roller 250, the metallic member 150 is made to pass through the pre-treating unit, the graphene forming unit and the cooling unit (if necessary) in sequence by being driven by the first roller 250 and the second roller 300. Then, the metallic member 150 coated with the graphene is collected by the second roller 300.

Figure 2:
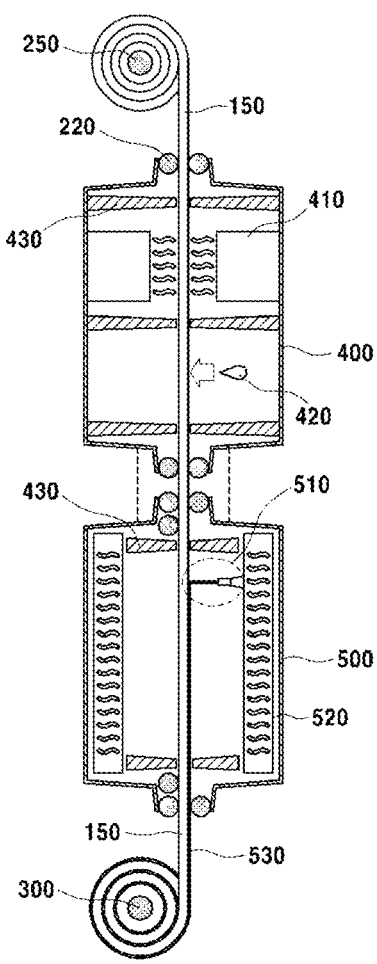
FIG. 2 is a cross sectional view showing a graphene roll-to-roll coating apparatus of a vertically configured chamber-type in accordance with an embodiment of the present disclosure.
Figure 3:
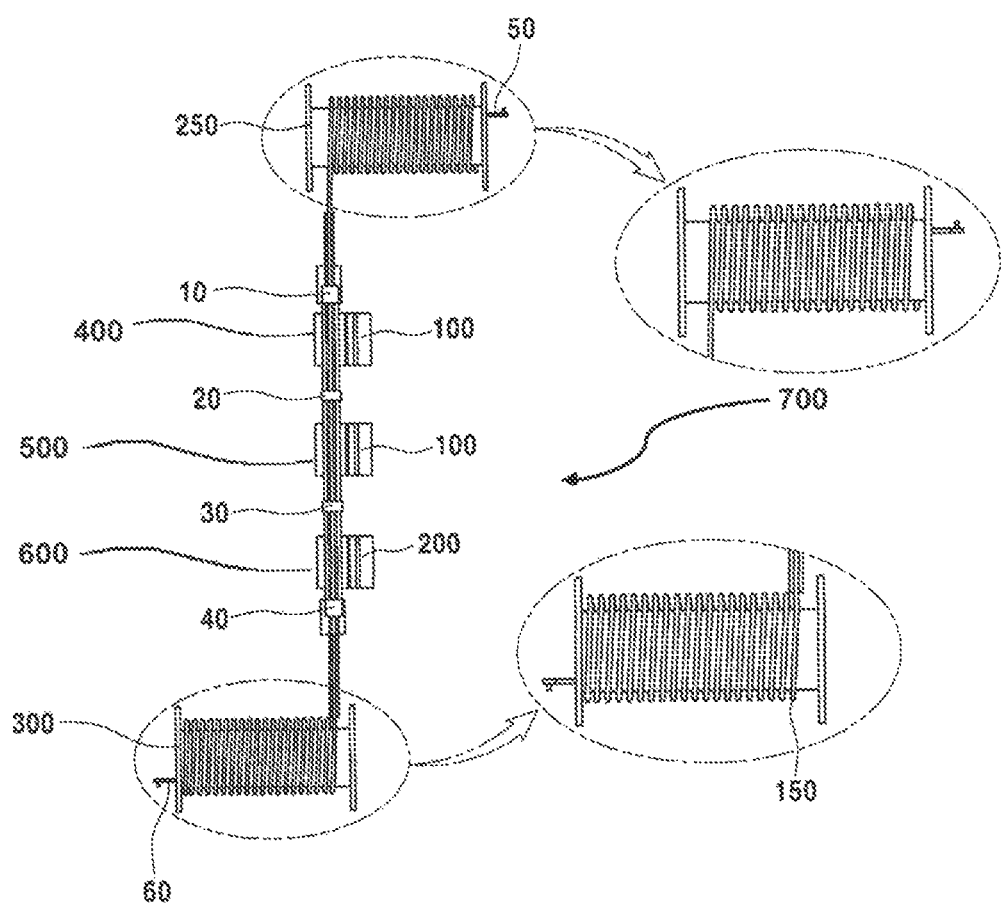
FIG. 3 is a schematic diagram of a tube-type graphene roll-to-roll coating apparatus in accordance with an embodiment of the present disclosure.
Figure 4:
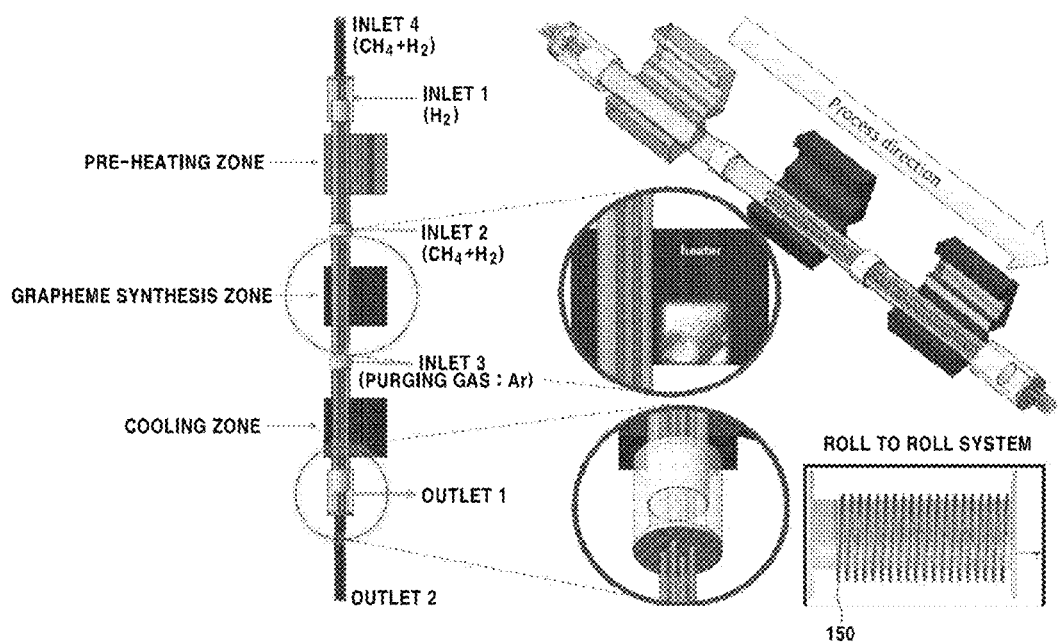
FIG. 4 is a schematic diagram of a vertically configured tube-type graphene roll-to-roll coating apparatus in accordance with an example of the present disclosure.
Figure 5:
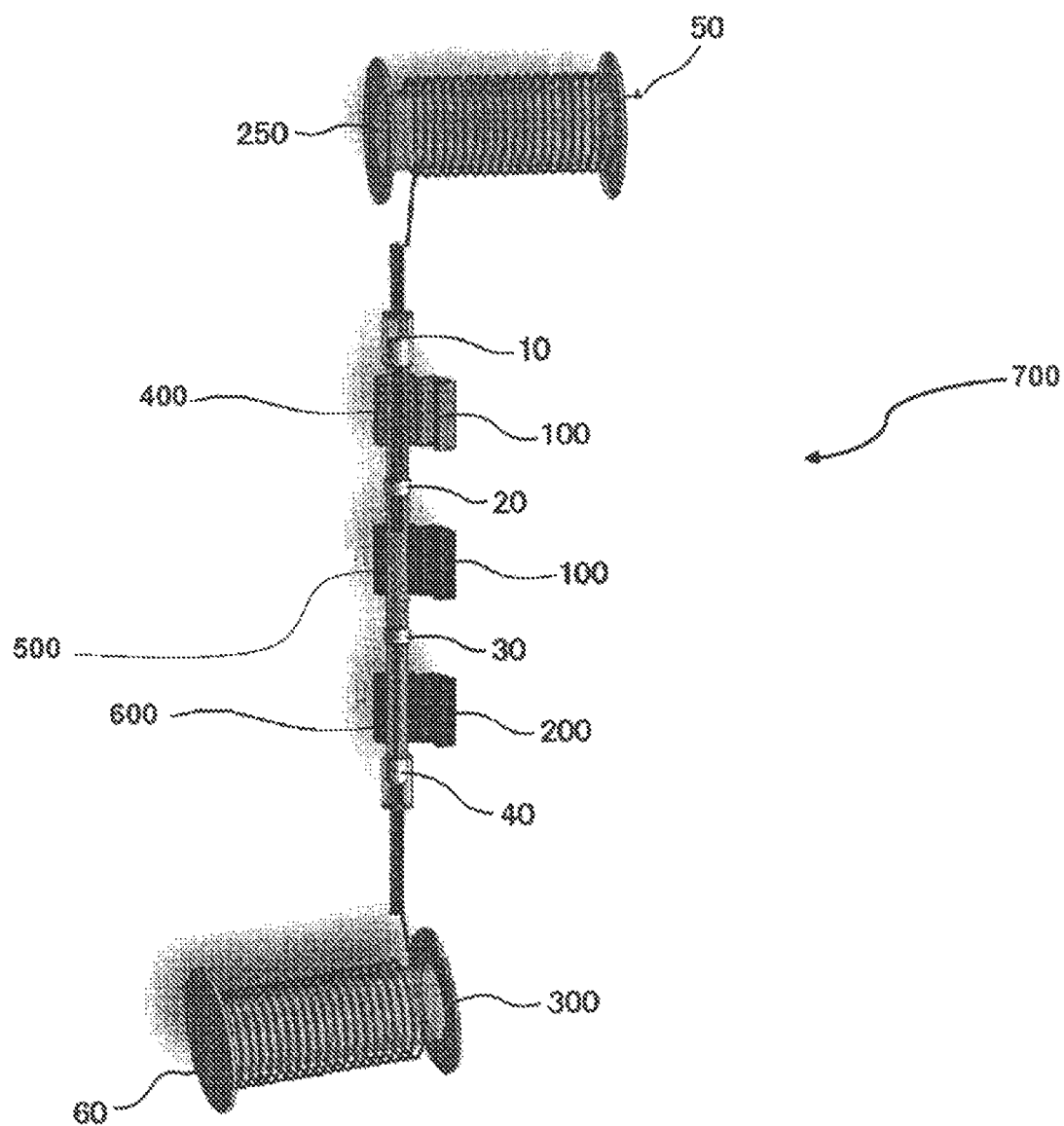
FIG. 5 is a diagram showing a horizontally configured tube-type graphene roll-to-roll coating apparatus in accordance with an example of the present disclosure.

The roll-to-roll coating apparatus in accordance with the illustrative embodiment of the present disclosure may be arranged vertically or horizontally (see FIGS. 1 to 5). To prevent or minimize bending of a metallic member and/or deformation of the metallic member at a high temperature and to maintain a stable heat gradient effectively, the apparatus may be arranged vertically (as illustrated in FIGS. 2, 3 and 4). In case that graphene is coated on a metallic member by depositing a metallic catalyzer for graphene growth on the metallic member, large-area crystallization of a catalyst layer may be enabled in the vertically arranged roll-to-roll coating apparatus, so that the graphene may be more easily coated on the metallic member. Further, in case that the apparatus is horizontally arranged (as illustrated in FIGS. 1 and 5), the apparatus can be operated by allowing the metallic member to be stably transferred through the use of a specially designed jig.

In the pre-treating unit 400, a process selected from a group consisting of a plasma process, a laser process, pre-heating and a combination thereof may be performed on a surface of the metallic member supplied by the first roller. By way of example, a plasma process, a laser process and a preheating process may be performed in sequence.

The plasma process and the laser process may be used to remove impurities on a metallic member or a metallic catalyzer on which graphene is to be formed. Further, to prevent transfer of the impurities removed by the plasma process and/or the laser process, partition walls 430 may be installed in the pre-treating unit between the plasma process and the laser process. Further, partition walls may be additionally formed at an inlet and/or an outlet of the pre-treating unit to block an inflow of external air.

The pre-heating process may include a process of heating the metallic member to a temperature at which chemical vapor deposition would progress easily before the formation and/or coating of graphene is performed in the graphene forming unit. Desirably, the pre-heating process may be performed when a high-temperature chemical vapor deposition method is performed in the graphene forming unit, but not limited thereto. Through the pre-heating process, the pre-treating unit can be heated to a temperature equal to or lower than a temperature of the graphene forming unit, e.g., to about 300° C. to about 2000° C., to about 300° C. to about 1000° C., or to about 300° C. to about 500° C.

Referring to FIGS. 1 and 2, in the roll-to-roll coating apparatus in accordance with the illustrative embodiment of the present disclosure, each of the pre-treating unit 400 and the graphene forming unit 500 may have a chamber shape. Desirably, such a chamber-type roll-to-roll coating apparatus may be used to coat graphene on a surface of a metallic plate, a metal sheet, a metal foil or the like, but not limited thereto.

Furthermore, in the graphene roll-to-roll coating apparatus, the chambers of the pre-treating unit 400 and the graphene forming unit 500 may be configured to communicate with each other to perform a series of processes stably. Alternatively, the separated pre-treating unit and the graphene forming unit may be additionally connected so as to maintain a low-pressure or a vacuum atmosphere during the coating process.

In the graphene forming unit 500, graphene is formed and coated on a surface of the pre-treated metallic member. The formation of the graphene may be performed by a chemical vapor deposition method typically employed in the art. By way of example, thermal chemical vapor deposition (T-CVD), rapid thermal chemical vapor deposition (RTCVD), plasma enhanced chemical vapor deposition (PECVD), inductively coupled enhanced chemical vapor deposition (ICPCVD), metal organic chemical vapor deposition (MOCVD), (low pressure chemical vapor deposition (LPCVD), and atmospheric pressure chemical vapor deposition (APCVD) may be employed, but not limited thereto.

In an illustrative embodiment, the graphene may be formed and coated on the surface of the metallic member 150 in the graphene forming unit by chemical vapor deposition by supplying a reactant gas containing a carbon source through a gas nozzle 510 within the graphene forming unit. The reactant containing a carbon source may be composed of only a carbon source or may be composed of a carbon source and a nonreactive gas such as helium or argon. Further, the reactant gas containing the carbon source may include hydrogen in addition to the carbon source. Hydrogen may be used to maintain the surface of the metallic member clean, to thereby control a gas phase reaction. The amount of the hydrogen may range from about 1 to 40 volume % of the entire volume of a vessel, desirably, about 10 to 30 volume % and, more desirably, about 15 to 25 volume %.

The carbon source may include, but not limited to, carbon monoxide, carbon dioxide, methane, ethane, ethylene, ethanol, acetylene, propane, butane, butadiene, pentane, pentene, cyclopentadiene, hexane, cyclohexane, benzene, or toluene.

If heat treatment is performed at a temperature of, e.g., about 300° C. to about 2000° C. by a temperature controllable heating source 520 while the reactant gas containing the carbon source is supplied into the graphene forming unit, carbon components existing in the carbon source may be bonded to each other and form a hexagonal plate-shaped structure on the surface of the metallic member 150, so that graphene is formed. The graphene may be single-layered or multi-layered.

The gas nozzle 510 may be one or plural. When necessary, a plurality of gas nozzles may be installed within the graphene forming unit so as to control degree of graphene formation. Further, in case that the gas nozzles are provided at one side within the chamber, e.g., either at a top surface or at a bottom surface of the inside of the chamber, the graphene may be formed only on one surface of the metallic member on the side where the gas nozzle is provided. However, by providing the gas nozzles at both top and bottom surfaces of the inside of the chamber, the graphene can be formed and coated on both surfaces of the metallic member.

Rollers 220 may be provided at inlets and/or outlets of the chamber-type pre-treating unit 400 and the chamber-type graphene forming unit 500. The rollers may have a function of minimizing or preventing bending of the metallic member and/or deformation of the metallic member at a high temperature and also a function of maintaining a heat gradient stably. Besides, the rollers may be cooling rollers for cooling the metallic member. In such a case, by providing the cooling rollers at the outlet of each chamber, the metallic member can be cooled to a desired temperature without having to install an additional cooling unit.

Referring to FIGS. 3 to 5, a roll-to-roll coating apparatus in accordance with another illustrative embodiment of the present disclosure may be configured to be of a single tube type to perform a series of processes stably. Desirably, such a tube-type roll-to-roll coating apparatus may be used for graphene coating of a metallic pipe or a metal wire, but not limited thereto.

The roll-to-roll coating apparatus may include a pre-treating unit 400, a graphene forming unit 500 and a cooling unit 600 as tube-type chambers communicating with each other in sequence. Each of the pre-treating unit, the graphene forming unit and the cooling unit may have a heating jacket 100 or a cooling jacket 200 on an exterior surface, so that their temperatures can be controlled. The roll-to-roll coating apparatus may be vertically or horizontally arranged as in the case of the above-described chamber-type roll-to-roll coating apparatus. Further, the roll-to-roll coating apparatus may further include a roller having a gas inlet for forming and coating graphene on an inner surface of the metallic pipe and capable of supplying a gas stably regardless of driving directions of rollers around which a metallic pipe is wound.

In a illustrative embodiment, the tube-type roll-to-roll coating apparatus may further include a first gas inlet 10 formed between the first roller 250 and the pre-treating unit 400, a second gas inlet 20 formed between the pre-treating unit and the graphene forming unit, a third gas inlet 30 formed between the graphene forming unit and the cooling unit and a first gas outlet 40 formed between the cooling unit and the second roller 300. Here, the first gas inlet 10 to the third gas inlet 30 and the first gas outlet 40 introduces or exhausts various kinds of gases necessary for forming and coating the graphene on the surface of the metallic member 150.

In an illustrative embodiment of the present disclosure, the first roller 150, the pre-treating unit, the graphene forming unit, the cooling unit and the second roller 300 may be arranged vertically or horizontally (see FIGS. 4 and 5). If the first roller 250, the pre-treating unit, the graphene forming unit and the second roller 300 are vertically arranged, bending of the metallic member and/or deformation of the metallic member at a high temperature can be prevented and a heat gradient can be stably maintained. To minimize bending and deformation at a high temperature when the apparatus is horizontally arranged, the metallic member 150 can be stably transferred through the use of a specially designed jig. In a roll-to-roll coating apparatus 700 in accordance with the present disclosure, the inside of the graphene forming unit or the inside of the coating apparatus may be driven under a vacuum or under an atmospheric pressure. If the roll-to-roll coating apparatus 700 is scaled up, a system may be set up such that graphene formation on the outside of the metallic member may be performed under an atmospheric pressure, while graphene formation on the inside of the metallic member, e.g., on the inside of the metallic pipe may be performed under a vacuum atmosphere, but not limited thereto.

In an illustrative embodiment, a sealing member (not shown) provided at an end of the pre-treating unit to introduce the metallic member 150 into the graphene roll-to-roll coating apparatus 700 may be made of polymer having high heat resistance, e.g., a PTEE (Polytetrafluoroethylene)-based rubber. Through the use of such a sealing member, a scratch on the graphene formed on the metallic member 150 or a gas leakage may be prevented.

In an illustrative embodiment, in case that the metallic member has an empty space inside, e.g., in case that the metallic member is a metallic pipe, the first roller 250 may be provided with a fourth gas inlet 50 for supplying a gas into the inside of the metallic pipe, and the second roller 300 may be provided with a second gas outlet 60 for exhausting the gas from the inside of the metallic pipe. The fourth gas inlet 50 and the second gas outlet 60 may be used for the process of forming and coating graphene on an inner surface of the metallic pipe. Through the fourth gas inlet 50, the gas can be stably supplied regardless of driving directions of the first and second rollers 250 and 300 around which the metallic pipe is wound. For the purpose, one end of the fourth gas inlet 50 may be designed to communicate with one end of the metal pipe wound around the first roller 250 within the first roller 250 through a flexible connecting member. Furthermore, one end of the second gas outlet 60 may also be designed to communicate with one end of the metal pipe wound around the second roller 300 within the second roller 300 through a flexible connecting member.

In accordance with another aspect of the present disclosure, there is provided a graphene roll-to-roll coating method using the graphene roll-to-roll coating apparatus as described above, the method including:

supplying a metallic member from a first roller to a pre-treating unit in a roll-to-roll manner;

performing a surface treatment on the supplied metallic member in the pre-treating unit;

transferring the metallic member into the graphene forming unit to form and simultaneously to coat graphene on a surface of the pre-treated metallic member; and collecting the metallic member coated with the graphene by a second roller in a roll-to-roll manner after the metallic member passes through the graphene forming unit.

In an exemplary embodiment, the graphene roll-to-roll coating method further includes transferring the graphene-coated metallic member into the cooling unit to cool the graphene-coated metallic member before the graphene-coated metallic member is collected by the second roller, but not limited thereto.

A reducing gas may be, e.g., a hydrogen gas, but not limited thereto. When a pre-heating process is performed in the pre-treating unit, the pre-treating unit may be heated to a temperature equal to or lower than a temperature of the graphene forming unit.

The graphene forming and coating process in the graphene forming unit may include all technical disclosures discussed above for the roll-to-roll coating apparatus, and redundant description will be omitted for the simplicity of explanation.

In an exemplary embodiment, the graphene roll-to-roll coating method further includes transferring the graphene-coated metallic member into the cooling unit to cool the graphene-coated metallic member before the graphene-coated metallic member is collected by the second roller, but not limited thereto.

The gas inlets and the gas outlets may be designed such that various gas supply lines are operated independently even in case that the first roller and the second roller are rotated in forward/backward directions in the graphene roll-to-roll coating apparatus 700.

In an exemplary embodiment, a purge gas is supplied through a third gas inlet formed between the graphene forming unit and the cooling unit, but not limited thereto. By way of example, the pure gas may be an argon gas, a nitrogen gas or a helium gas, but not limited thereto.

In an exemplary embodiment, a gas having passed through the pre-treating unit, the graphene forming unit and the cooling unit is exited through a first gas outlet formed between the cooling unit and the second roller, but not limited thereto.

In an exemplary embodiment, the graphene roll-to-roll coating method may further include, but not limited thereto:

forming multi-layered graphene on the metallic member by performing a series of processes one or more times, wherein the series of processes include:

forming a metallic catalyst layer on the surface of the graphene-coated metallic member collected by the second roller; and forming and simultaneously coating additional graphene on the graphene-coated metallic member on which the metallic catalyst layer by using the graphene roll-to-roll coating apparatus.

Through this process, multi-layered graphene in 10 or more layers can be formed on a metallic member as a protective film.

By way of example, a single-layered graphene film may be formed on a surface of a copper pipe. Then, a metallic catalyst layer for graphene growth such as nickel capable of forming a relatively thick graphene layer may be deposited on the graphene film coated on the surface of the copper pipe by electroplating or the like. Thereafter, by allowing the cooper pipe to pass through the graphene roll-to-roll coating apparatus, a graphene film including 10 or more layers of graphene may be additionally coated on an outer wall of the copper pipe as a graphene protective film.

In an exemplary embodiment, the metallic member includes a metal or metal alloy selected from a group consisting of Ni, Co, Fe, Pt, Au, Al, Cr, Cu, Mg, Mn, Mo, Rh, Si, Ta, Ti, W, U, V, Zr, brass, bronze, white brass, stainless steel, Ge and a combination thereof, but not limited thereto.

In an exemplary embodiment, the metallic catalyst layer includes a metal or metal alloy selected from a group consisting of Ni, Co, Fe, Pt, Au, Al, Cr, Cu, Mg, Mn, Mo, Rh, Si, Ta, Ti, W, U, V, Zr, brass, bronze, stainless steel, Ge and a combination thereof, but not limited thereto.

In an illustrative embodiment, the metallic catalyst layer for graphene growth may be a thin film or a thick film, but not limited thereto. In case that the catalyst layer is a thin film, its thickness may range from, e.g., about 1 nm to about 1000 nm, but not limited thereto. Further, in case that the catalyst layer is a thick film, its thickness may range from, e.g., about 0.01 mm to 5 mm, but not limited thereto.

Figure 6:
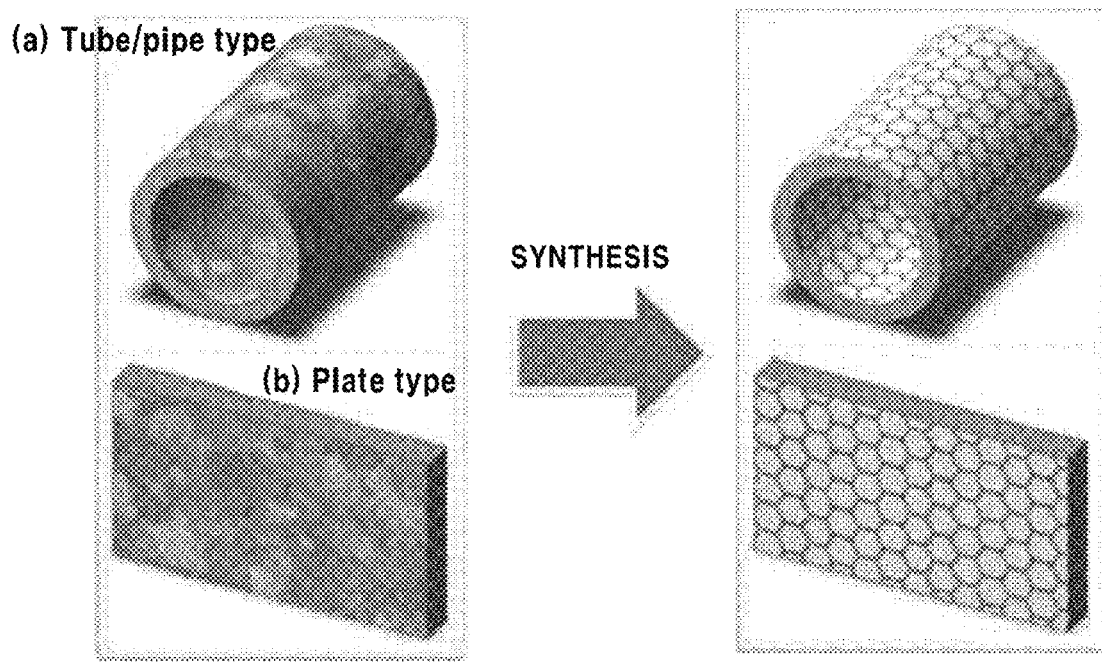
FIG. 6 provides a diagram showing a metallic member coated with graphene and also provides an analysis result using a Raman spectrum showing a presence or absence of a graphene coating on the metallic member.

In accordance with still another aspect of the present disclosure, there is provided a metallic member coated with graphene, formed by a graphene roll-to-roll coating method as described above (see FIG. 6). Either one surface or both surfaces of the metallic member 150 may be coated with single-layered or multi-layered graphene. The metallic member 150 may be coated with the graphene through the above-discussed graphene roll-to-roll coating process and may be provided in a roll type.

In an illustrative embodiment, the metallic member may be used as a heat pipe or a heat plate. Such a heat pipe or heat plate may be used in a heat transfer system having wide applications in various electric appliances, air conditioning systems, mechanic systems and space engineering. When such a heat transfer system is manufactured by using a heat pipe or a heat plate of which surface is coated with graphene in accordance with the present disclosure, heat transfer efficiency can be improved.

Figure 7:
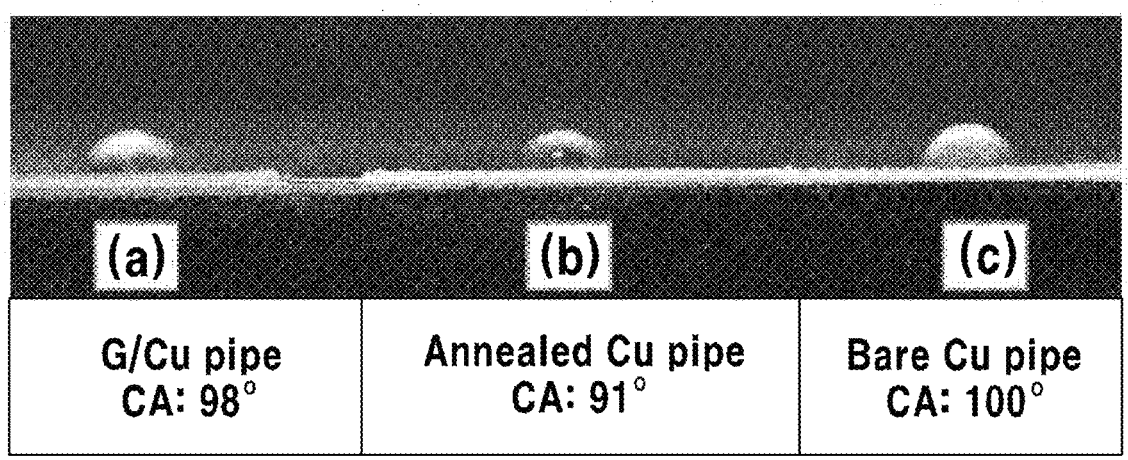
FIG. 7 shows analysis results of contact angle of the fluid for evaluating fluid resistance of the fluid flowing within heat pipes in accordance with an example of the present disclosure and comparative examples.

FIG. 7 shows analysis results of contact angle of the fluid for evaluating fluid resistance of the fluid flowing within copper heat pipes in accordance with an example of the present disclosure and comparative examples. FIG. 7 shows images of surfaces of the respective copper heat pipe samples.

For the analysis of contact angles, three types of samples were prepared. In FIG. 7, (a) is a copper heat pipe coated with graphene by the graphene roll-to-roll coating apparatus 700; (b), a copper heat pipe undergone through high-temperature hydrogen annealing (reducing process); and (C), a bare copper pipe on which a great amount of surface oxide layer is formed). Water was used as a liquid. The copper heat pipe coated with graphene is prepared by using the graphene roll-to-roll coating apparatus 700. To elaborate, the copper heat pipe coated with graphene was prepared through the steps of supplying a copper heat pipe from the first roller 250 into the pre-treating unit (about 800° C.) in a roll-to-roll manner; pre-heating the supplied copper heat pipe in the pre-treating unit (about 800° C.) while flowing $H_2$ of about 10 sccm under an atmospheric pressure or at about 180 mTorr; transferring the pre-heated copper heat pipe into the graphene forming unit pre-heated to about 1000° C.) and forming and coating graphene on a surface of the copper heat pipe; transferring the copper heat pipe coated with the graphene into the cooling unit and cooling it therein; and collecting the copper heat pipe coated with the graphene by the second roller through a roll-to-roll mechanism after the copper pipe passes through the cooling unit. In the process of forming and coating the graphene, a reactant gas containing a carbon source ($CH_4$: $H_2$=30:10 sccm) for graphene formation was supplied through the second gas inlet 20 for about 30 minutes at about 1.6 Torr, so that the graphene was formed and coated on the surface of the copper heat pipe at the same time. Thereafter, the copper heat pipe coated with the graphene was cooled by supplying an Ar gas as a purge gas was supplied through the third gas inlet 30 provided between the graphene forming unit and the cooling unit. When necessary, the reactant gas containing the carbon source for graphene formation may be additionally supplied into the inside of the cooper heat pipe through the fourth gas inlet 50 provided in the first roller 250, so that the graphene may be formed and coated on an external surface and an internal surface of the copper heat pipe while the copper heat pipe passes through the graphene forming unit.

Here, in the cases of (a) and (c), contact angles were found to be higher than a contact angle on the surface of the bare copper pipe (b) by about 5 degree or more, which implies that there may be a difference in liquid resistances when the same liquid flows through the respective copper heat pipes. Further, by performing heat-treatment on the surface of the copper heat pipe after the graphene is coated on the surface of the copper heat pipe, surface roughness of the copper pipe can be improved, and, thus, the liquid resistance within the heat pipe coated with the graphene may be further ameliorated.

Figure 8:
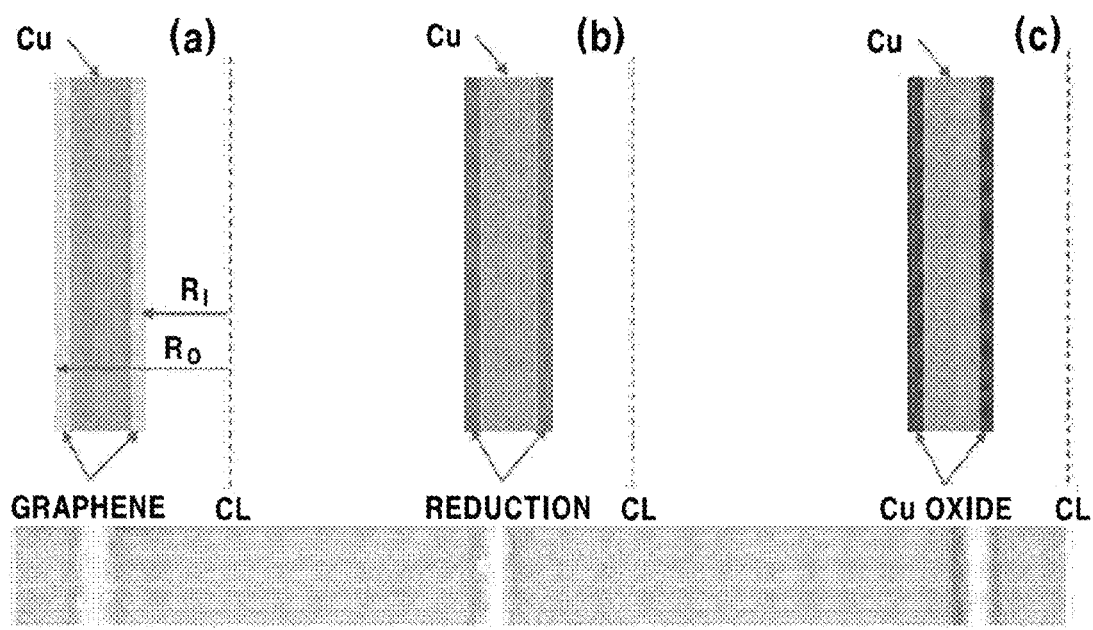
FIG. 8 shows an evaluation result of anti-chemical/anti-corrosion property of a surface of a copper heat pipe coated with a graphene film under a liquid environment and an atmospheric environment in accordance with an example of the present disclosure and evaluation results of anti-chemical/anticorrosion properties of surfaces of copper heat pipes in accordance comparative examples.

FIG. 8 shows an evaluation result of anti-chemical/anti-corrosion property of a surface of a copper heat pipe coated with a graphene film under a liquid atmosphere and an atmospheric atmosphere in accordance with an example of the present disclosure and evaluation results of anti-chemical/anticorrosion properties of surfaces of copper heat pipes in accordance comparative examples. The same samples as used in FIG. 7 were used, and surface states of the respective samples were compared through optical microscope analysis. As for experiment conditions, the samples were submerged in water for one day, and after the samples were dried under an atmospheric atmosphere (atmospheric pressure) for about 10 hours, the surfaces of the samples were observed. In case of the sample (a), a surface change was hardly observed before and after an oxidation test. In case of the sample (b), degree of oxidation was highest among the three samples, and, especially, a great amount of oxidized metal material in the form of snowflakes was found to float on the surface of the copper heat pipe. Meanwhile, in case of the sample (c), an oxide layer is naturally formed on the surface of the copper heat pipe over a long period of time, no rapid oxidation reaction as in the case of the sample (b) was observed. This result shows that storage state and operation environment (temperature, humidity, etc) as well as the fabrication process of the metallic member 150 may be a critical factor that affects performance and lifetime of the metallic member 150.

Accordingly, in accordance with the present disclosure, the metallic member 150 coated with graphene may be provided by using the graphene coating method and the graphene coating apparatus before an oxide film is formed on the surface of the metallic member. Since the graphene protects the metal surface, anti-chemical/anti-corrosion property of the metallic member 150 coated with the graphene can be improved, and surface resistance between the liquid and the inside of the heat pipe can be minimized.

FIGS. 9A to 9E show evaluation results of heat conductivity of a high-temperature liquid (including a gas) for heat pipes in accordance with an example of the present disclosure and comparative examples, and also illustrate an experiment apparatus used in the experiment.

Figure 9A:
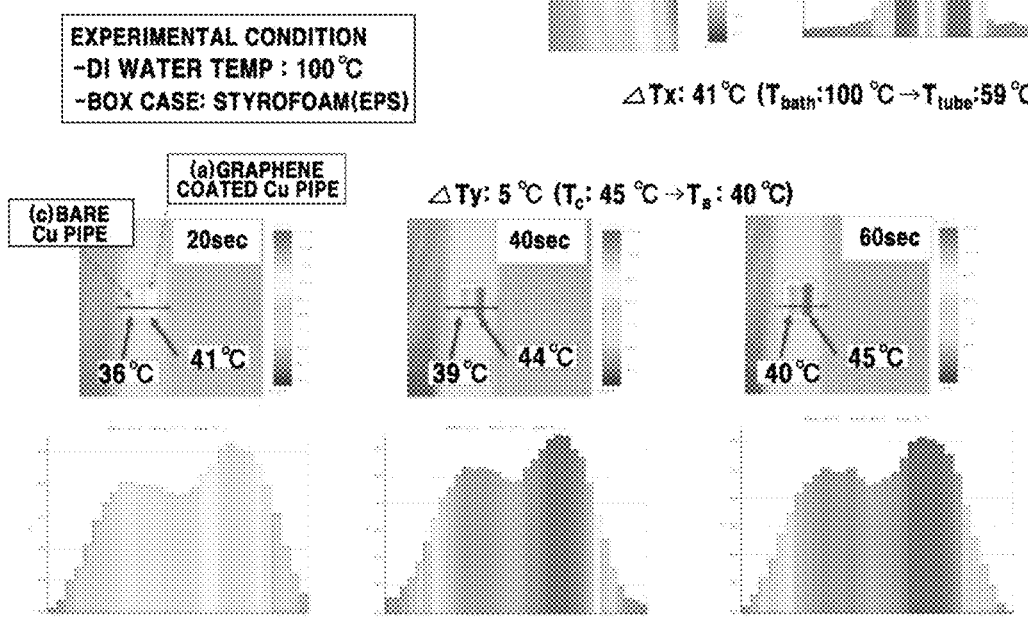
FIGS. 9A to 9E show evaluation results of heat conductivity of a high-temperature fluid (including a gas) for heat pipes in accordance with an example of the present disclosure and comparative examples, and also illustrate an experiment apparatus used in the experiment.
Figure 9B:
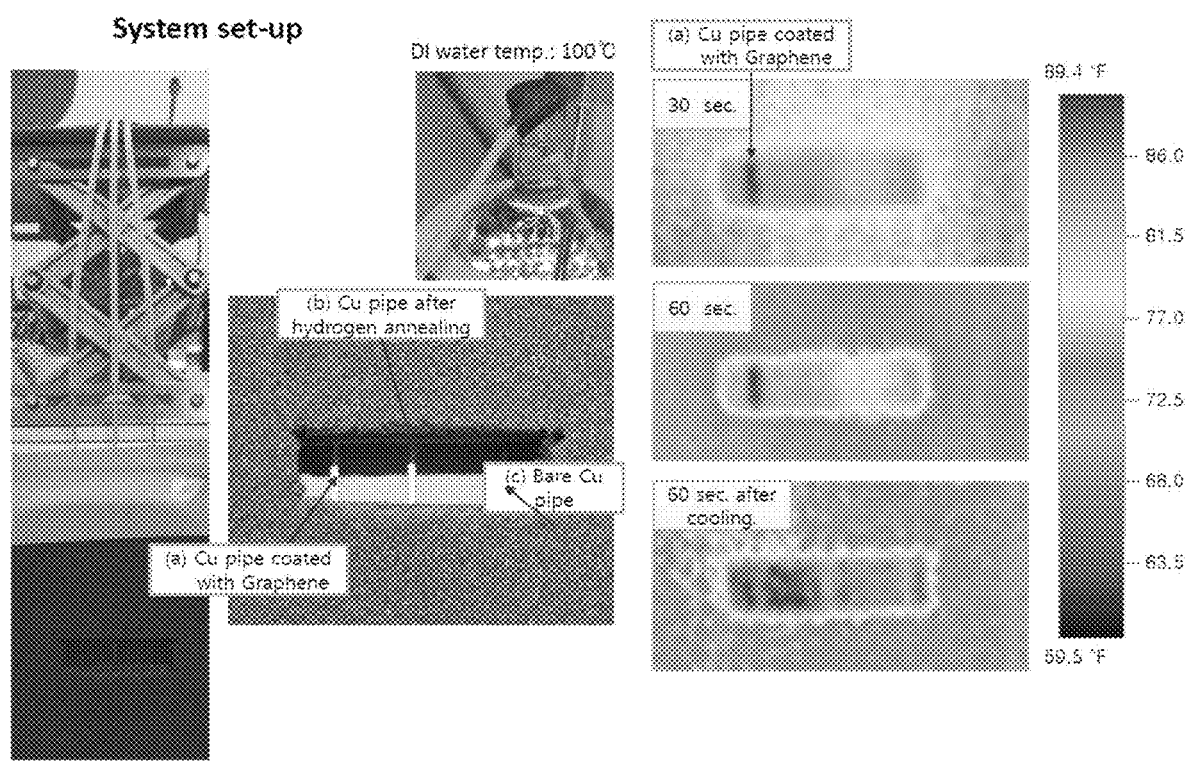
Figure 9C:
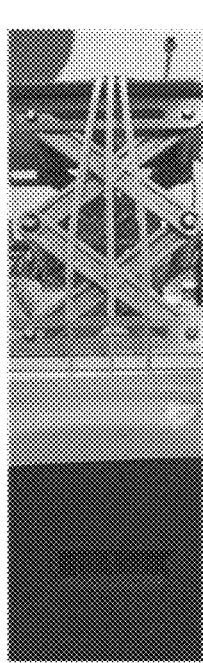
Figure 9C:
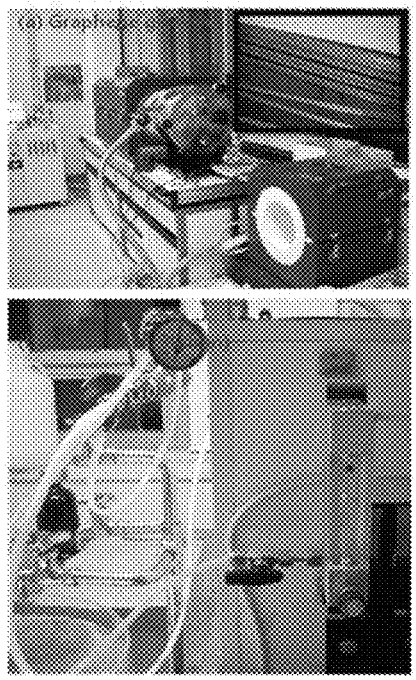
Figure 9C:
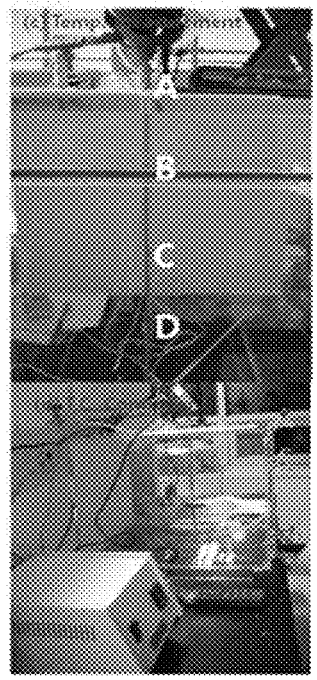
Figure 9D:
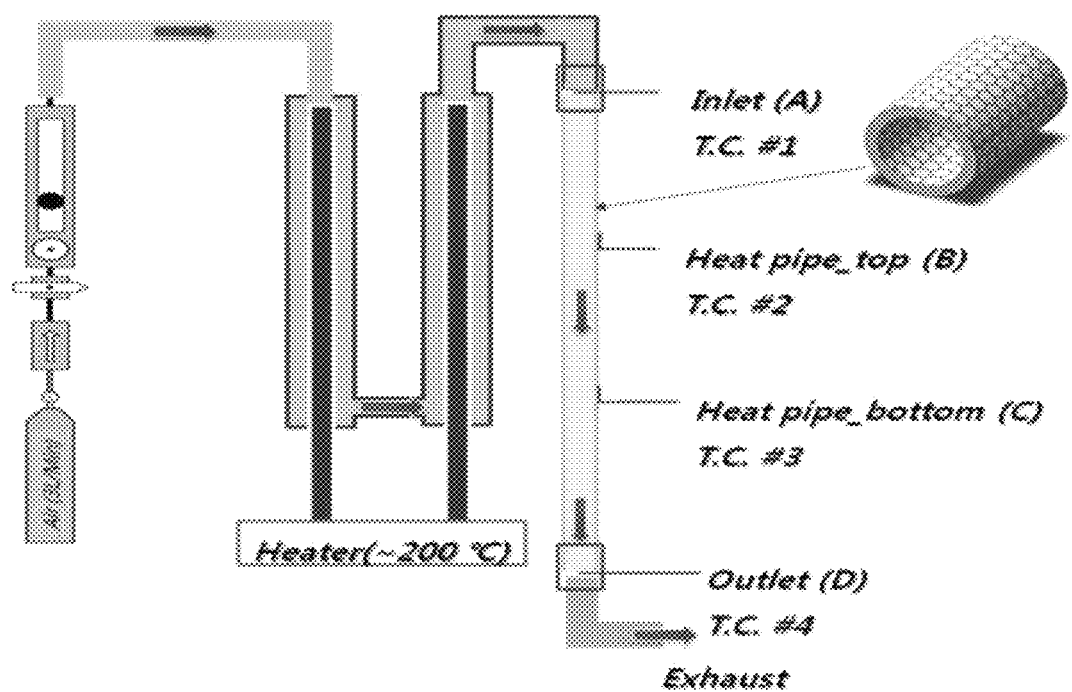

The same samples as used in FIG. 7 were used in FIGS. 9A to 9E. FIG. 9A. FIG. 9A indicates a case of (a) a copper heat pipe coated with graphene and a case of (c) a bare copper heat pipe (on which a great amount of surface oxide layer is formed), and FIG. 9B shows a case of (b) a copper heat pipe undergone through high-temperature hydrogen annealing (reducing process).

Referring to FIG. 9A, although an initial supply temperature of water was fixed at about 100° C., the temperature of the wafer decreased by about 41° C. until the water reached the copper heat pipes. However, since the temperatures of inlets of the heat pipes were maintained at about 59° C. in both cases (a) and (c), influence on evaluation results of heat conductivity properties of the heat pipes is regarded to be insignificant.

For a heat conductivity test through a thermal image camera, a liquid was supplied to the copper heat pipes for about 60 seconds. To compare temperature distributions, a temperature difference in each case was analyzed by using a Testo IRsoft program upon the lapse of about 20 seconds and about 60 seconds after the liquid was supplied. Through this experiment, a constant temperature difference of about 5° C. was found to be generated between the two heat pipes through the entire time range. Thus, the result of this experiment shows that heat transfer efficiency can be greatly improved in case of using the heat pipe coated with graphene, as compared to the heat pipe without being coated with graphene. Besides, a temperature difference between the two heat pipes may be expected to be even greater in case of heat transfer of a liquid within a high temperature range (within about 300° C.)

Referring to FIG. 9B, although an initial supply temperature of water was fixed at about 100° C., the temperature of the wafer decreased by about 41° C. until the water reached the copper heat pipe, the same as described in FIG. 9a. However, the temperatures of inlets of the heat pipes were maintained at about 59° C. in all cases (a), (b) and (c). Then, to observe an instant temperature variation for each heat pipe, water was supplied to each pipe for about 60 seconds and the supply of the water was then stopped. To compare temperature distributions, temperature differences in the respective cases were analyzed by using a Testo IRsoft program upon the lapse of about 30 seconds and about 60 seconds after the liquid was supplied and, also, upon the lapse of about 60 seconds after the water supply was stopped. The analysis result using a thermal image camera indicates that only the heat pipe coated with graphene shows a great improvement in heat transfer property through the entire time range.

The heat pipe coated with graphene in accordance with the present disclosure is expected to exhibit heat transfer efficiency about 8% higher than that of a conventional heat pipe.

Based on the analysis discussed above, FIGS. 9C and 9D illustrate experiment equipment used to measure a temperature variation for a certain part inside and outside of the heat pipes while flowing a high-temperature gas into the heat pipes. To conduct more detailed analysis than that discussed above, thermocouples were installed at inlets, outlets and two central portions of each heat pipe, and the system was set up to obtain data on a real time basis. Further, by using a thermal image camera, temperature distributions were observed at the same time.

Figure 9E:
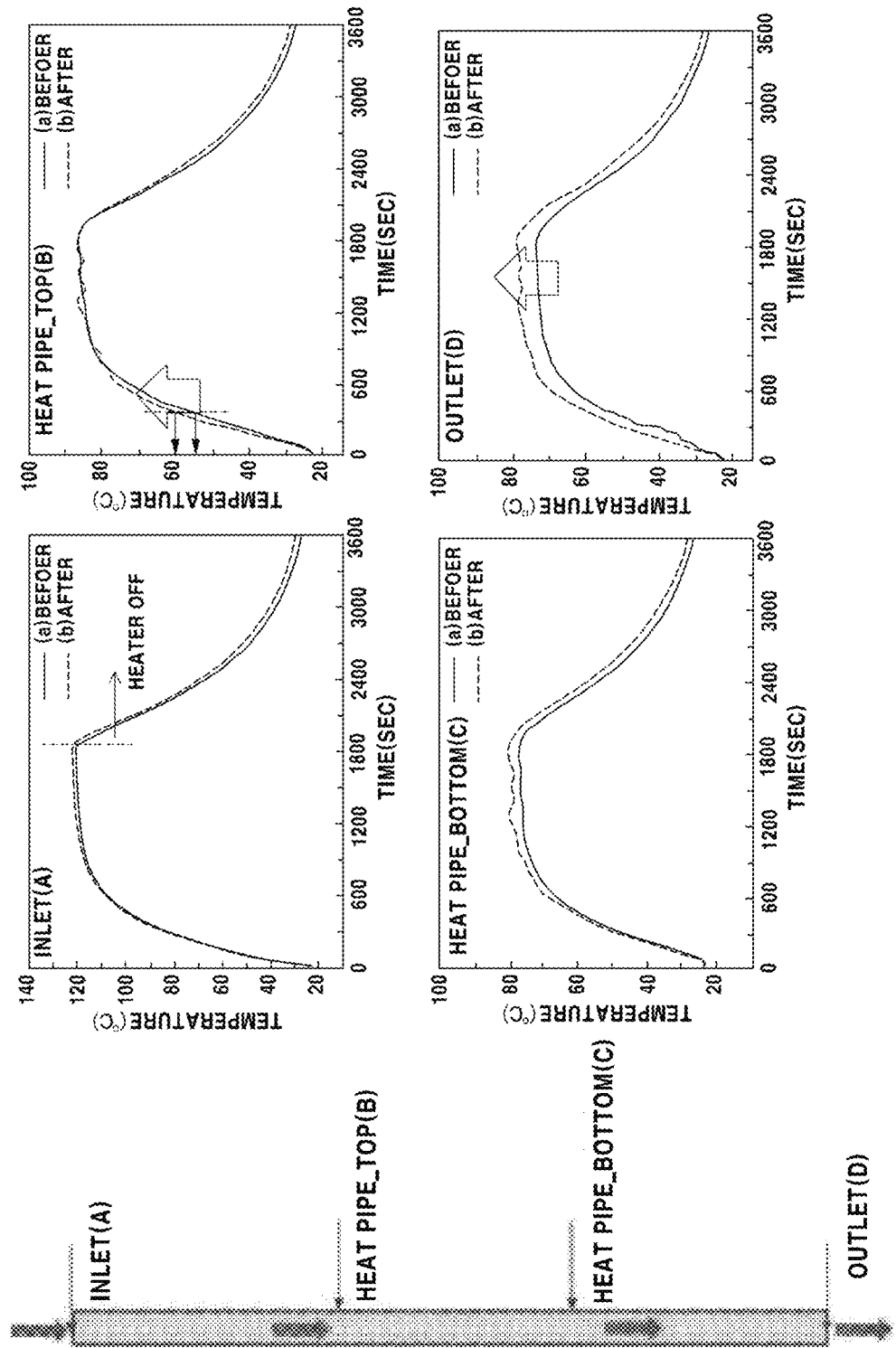

As a result of obtaining real-time temperature data using the thermocouples, a graph (B) of FIG. 9E indicates that the heat transfer efficiency of the heat pipe coated with graphene was improved by a maximum of about 8.6% as compared to the heat pipes without being coated with graphene. Besides, as a result of analyzing collected heat temperature distributions, a graph (D) of FIG. 9E indicates that collected heat efficiency was improved by about 7.6% in case of the heat pipe coated with graphene, as compared to the heat pipes without coated with graphene.

Figure 10:
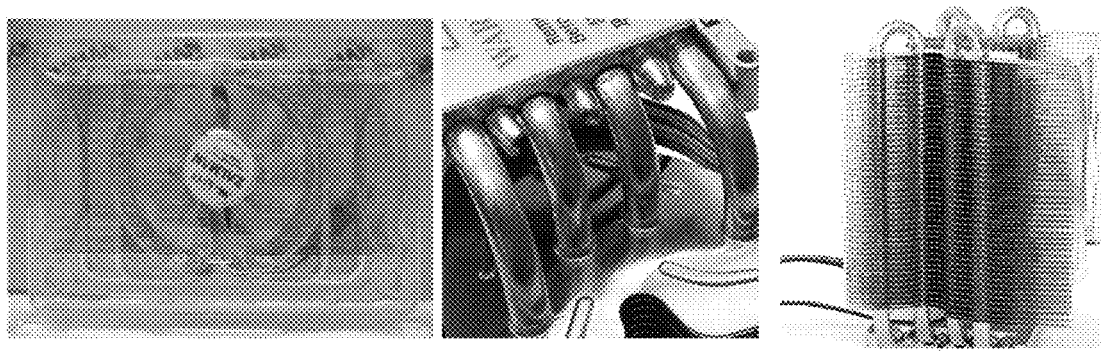
FIG. 10 provides images showing a heat pipe or a heat plate coated with graphene in accordance with examples of the present disclosure.

Thus, the heat pipe coated with graphene can be widely used in rapid heating and rapid cooling systems because it enables rapid thermal diffusion. FIG. 10 shows a heat pipe or a heat plate in accordance with an example of the present disclosure.

Figure 11:
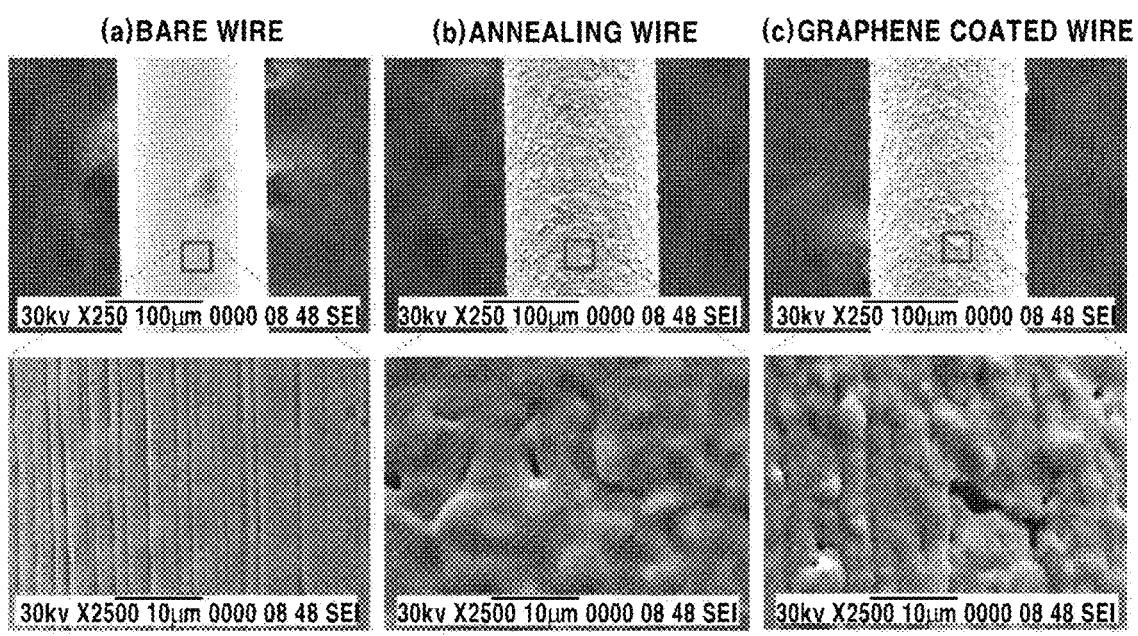
FIG. 11 provides electron micrographs showing the surface and diameter change of Cu/Ni wire in accordance with examples of the present disclosure and comparative examples.

FIG. 11 shows electron micrographs showing the surface and diameter change of Cu/Ni wire in accordance with examples of the present disclosure and comparative examples. Specifically, FIG. 11A shows a bare Cu/Ni wire as a comparative example, FIG. 11B shows a Cu/Ni wire treated by a high-temperature hydrogen annealing as a comparative example, and FIG. 11C shows a Cu/Ni wire coated with graphene as an example according to the present disclosure. The diameter changes for each of those Cu/Ni wires are shown in the following Table 1.

TABLE 1

The diameter changes for the Cu/Ni wires

| Wire type | Bare Cu/Ni wire (μm) | Annealed Cu/Ni wire (μm) | Graphene coated Cu/Ni wire (μm) |
|---|---|---|---|
| Cu/Ni (Atmospheric pressure) | 104.8 | 107.5 | 108.5 |
| | 131.2 | 138.4 | 139.3 |
| | 169.6 | 173.6 | 176 |
| | 184 | 192 | 193.6 |
| | 206.4 | 212.8 | 217 |

Using a 4-point probe method, resistances were measured for each of the three Cu/Ni wires treated differently as mentioned above, (see FIG. 12A).

Figure 12:
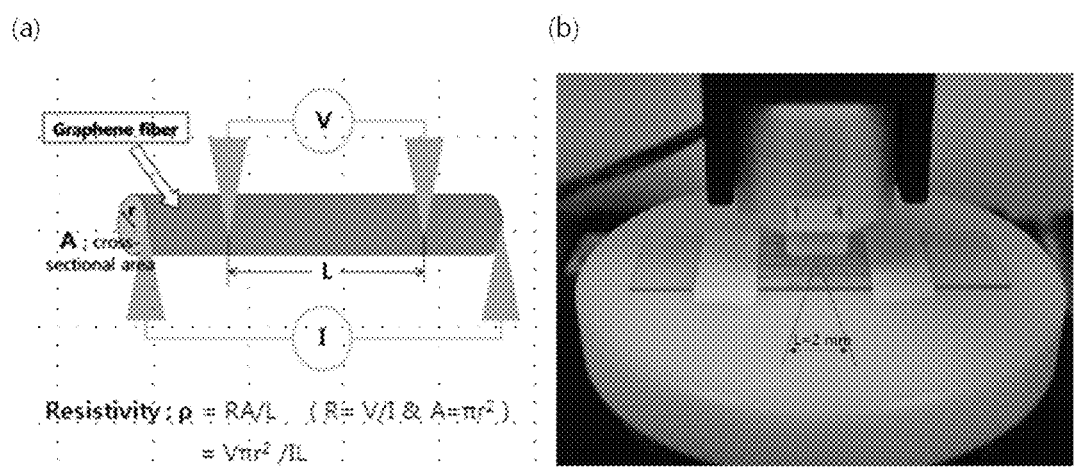
FIG. 12 provides a method and an apparatus for measuring resistivity of a metal wire in accordance with examples of the present disclosure and comparative examples.
Figure 13:
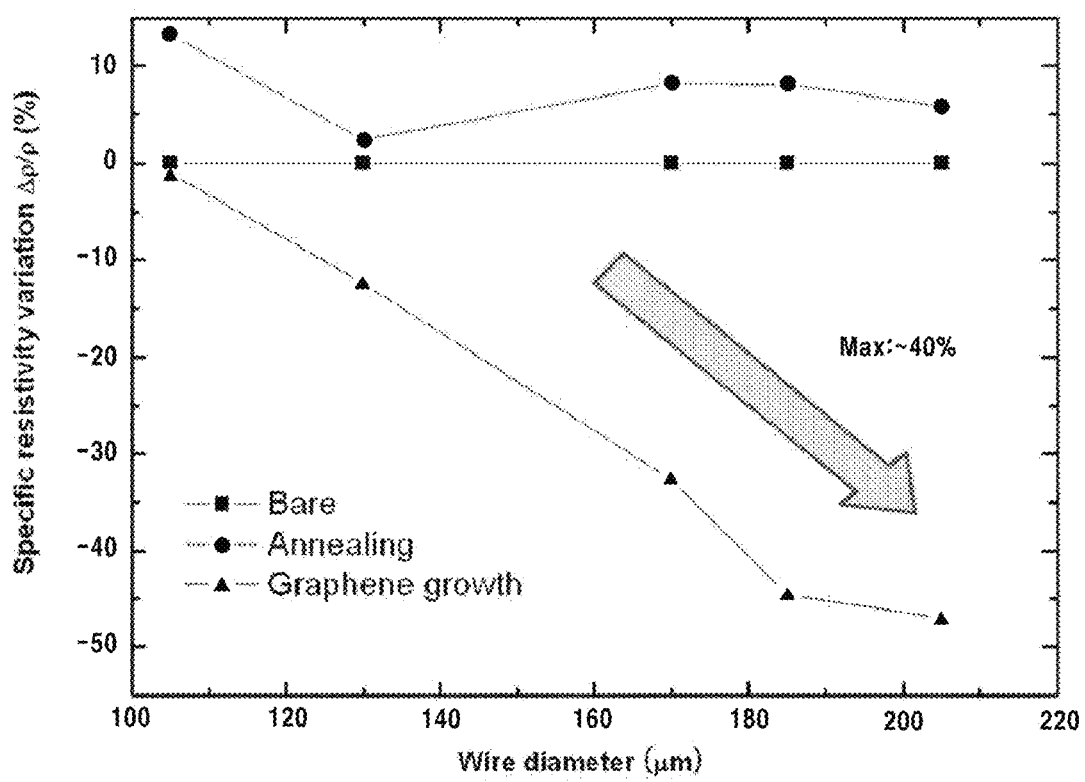
FIG. 13 provides graphs showing changes in resistivity according to a diameter of Cu/Ni wire in accordance with examples of the present disclosure and comparative examples.

FIG. 12B shows a photograph of the 4-point probe apparatus. Referring to FIG. 13, resistance variation for the bare Cu/Ni wire (a), the Cu/Ni wire treated by a high-temperature hydrogen annealing (b) and the Cu/Ni wire coated with graphene as an example according to the present disclosure (c) were measured. As a result, the Cu/Ni wire treated by a high-temperature hydrogen annealing showed a higher resistivity than the bare Cu/Ni wire, and the Cu/Ni wire coated with graphene as an example according to the present disclosure showed a lower resistivity than the bare Cu/Ni wire. Further, the resistivity of the Cu/Ni wire coated with graphene becomes lower as a diameter of the Cu/Ni wire becomes larger, confirming that electrical property the Cu wire coated with graphene was improved up to 47%.

Figure 14:
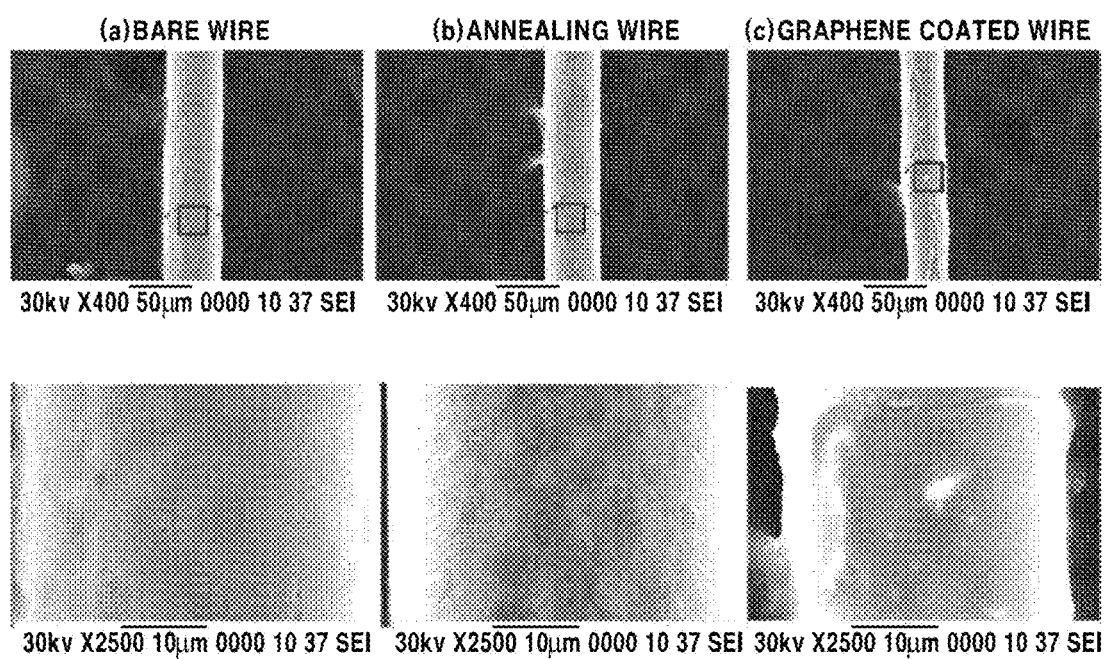
FIG. 14 provides electron micrographs showing the surface and diameter change of Cu wire in accordance with examples of the present disclosure and comparative examples.

FIG. 14 provides electron micrographs showing the surface and diameter change of Cu wire in accordance with examples of the present disclosure and a comparative example. Specifically, FIG. 14A shows a bare Cu wire as a comparative example, FIG. 14B shows a Cu wire treated by a high-temperature hydrogen annealing as a comparative example, and FIG. 14C shows a Cu wire coated with graphene as an example according to the present disclosure. The diameter changes for each of those Cu wires are shown in the following Table 2.

TABLE 2

The diameter changes for the Cu wires

| Wire type | Bare Cu wire (μm) | Annealed Cu wire (μm) | Graphene coated Cu wire (μm) |
|---|---|---|---|
| Cu (vaccum) | 51.6 | 44.8 | 49.4 |
| | 27.2 | 25.4 | 22.96 |

Figure 15:
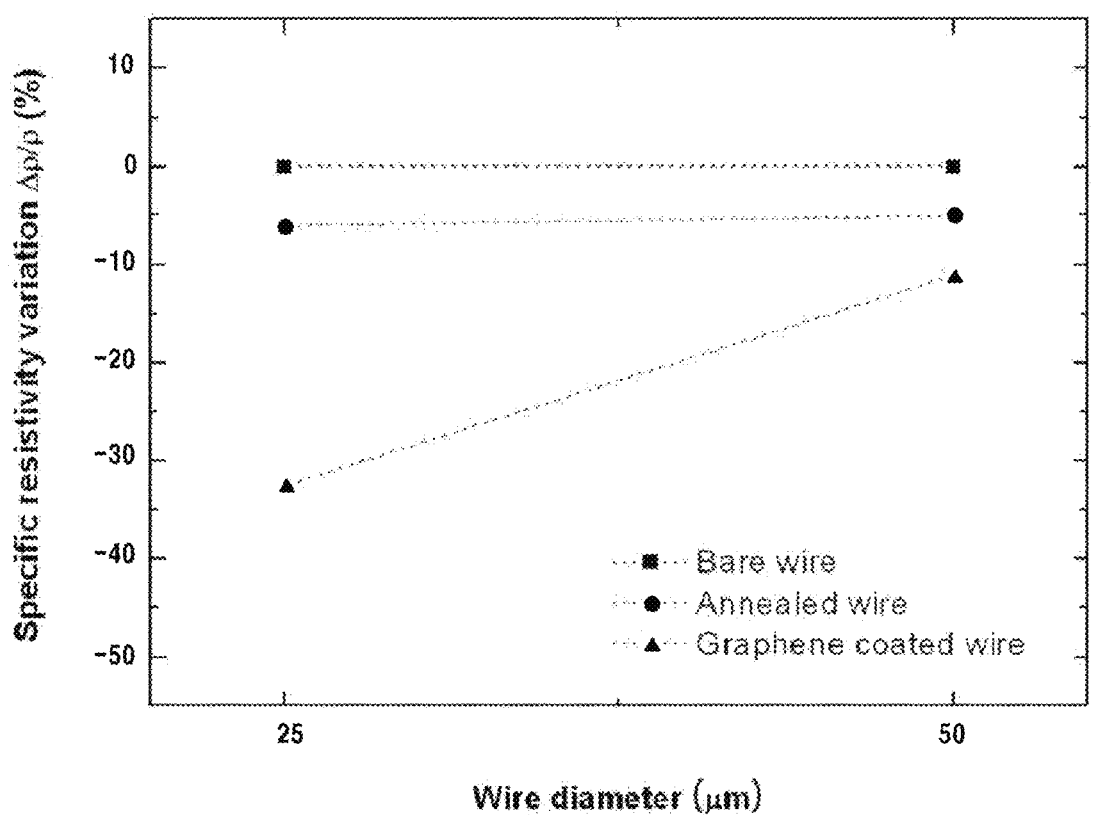
FIG. 15 provides graphs showing changes in resistivity according to a diameter of Cu wire in accordance with examples of the present disclosure and comparative examples.

FIG. 15 shows graphs showing changes in resistivity according to a diameter of Cu wire in accordance with examples of the present disclosure and comparative examples. Referring to FIG. 15, the Cu wire treated by a high-temperature hydrogen annealing showed a lower resistivity than the bare Cu wire, which is different from the above the Cu/Ni wire treated by a high-temperature hydrogen annealing. Further, the Cu wire coated with graphene as an example according to the present disclosure showed the lowest resistivity than the bare Cu/Ni wire and the Cu wire treated by a high-temperature hydrogen annealing. Further, the resistivity of the Cu wire coated with graphene becomes higher as a diameter of the Cu wire becomes larger, confirming that electrical property of the Cu wire coated with graphene was improved up to 32%.

Graphene-coated metallic members according to the present disclosure may be applied to a heat pipe system in a wide range of industry areas as a heat pipe or a heat plate. By way of example, such metallic members may be applied to an electric/electronic field, air conditioning systems, a mechanic field, space engineering, hydraulic or air pressure metal-based pipe systems, cooling and heating systems for buildings, and so forth. To be more specific, such metallic members in accordance with the present disclosure may be widely used in a waste heat collecting device, an air conditioning and cooling system, a solar energy collector, a cooling system of an atomic reactor, and so forth, and also be used for cooling a power line, an electronic circuit, a power generator, a transformer and the like, for cooling an electronic component and device, for cooling a metal cutter or the like, for cooling an electric motor, for local heating and heat control, for ice manufacturing and snow manufacturing, for controlling a temperature of a component of a spacecraft and a spacesuit, for heat control of a satellite and a flying vehicle, and so forth.

While various aspects and embodiments have been described herein, other aspects and embodiments will be apparent to those skilled in the art. The various aspects and embodiments disclosed herein are for the purposes of illustration and are not intended to be limiting. Therefore, the true scope of the disclosure is indicated by the appended claims rather than by the foregoing description, and it shall be understood that all modifications and embodiments conceived from the meaning and scope of the claims and their equivalents are included in the scope of the disclosure.

What is claimed is:

1. An apparatus for coating a metallic member with graphene, comprising:
    a first roller that continuously supplies the metallic member;
    a pre-treating unit that performs a surface treatment on the metallic member supplied through the first roller as the metallic member passes continuously through the pre-treating unit, wherein the pre-treating unit performs, on the surface of the metallic member supplied from the first roller, a process for removing impurities from the metallic member that includes a plasma process and a laser process, and further wherein at least one partition wall is provided within the pre-treating unit between an area where the plasma process is performed and an area where the laser process is performed, to thereby prevent the impurities from passing between the area where the plasma process is performed and the area where the laser process is performed;
    a graphene forming unit including at least one gas nozzle configured to deposit reactant gas directly onto a treated surface of the metallic member to form a graphene film on the treated surface of the metallic member, as the metallic member passes continuously through the graphene forming unit; and
    a second roller that collects the metallic member coated with the graphene film after the metallic member passes through the graphene forming unit,
    wherein within the pre-treating unit, the area where the plasma process is performed and the area where the laser process is performed are configured and arranged such that the plasma process is performed before the laser process.

2. The coating apparatus of claim 1, further comprising:
    a cooling unit that cools the graphene-coated metallic member prior to collecting the metallic member coated with the graphene film by the second roller.

3. The coating apparatus of claim 2, wherein the first roller, the pre-treating unit, the graphene forming unit, the cooling unit and the second roller are vertically or horizontally arranged.

4. The coating apparatus of claim 2, wherein the pre-treating unit, the graphene forming unit and the cooling unit have tube shapes and are arranged so as to communicate with each other.

5. The coating apparatus of claim 4, further comprising:
    a first gas inlet formed between the first roller and the pre-treating unit;
    a second gas inlet formed between the pre-treating unit and the graphene forming unit;
    a third gas inlet formed between the graphene forming unit and the cooling unit; and
    a first gas outlet formed between the cooling unit and the second roller.

6. The coating apparatus of claim 5, wherein the first roller is provided with a fourth gas inlet for supplying gas into an inside of the metallic member, and the second roller is provided with a second gas outlet for exiting the gas from the inside of the metallic member.

7. The coating apparatus of claim 4, wherein each of the pre-treating unit and the graphene forming unit has a temperature controllable heating jacket, and the cooling unit has a temperature controllable cooling jacket.

8. The coating apparatus of claim 1, wherein the metallic member includes a metallic pipe, a metallic plate, a metallic sheet, a metallic wire or a metallic foil.

9. The coating apparatus of claim 1, wherein the pre-treating unit and the graphene forming unit are provided in separate chambers.

10. The coating apparatus of claim 9, wherein the chamber of the graphene forming unit has a partition wall.

11. The coating apparatus of claim 9, further comprising a roller provided at an inlet and/or an outlet of the chamber for the pre-treating unit.

12. The coating apparatus of claim 9, further comprising a roller provided at an inlet and/or an outlet of the chamber for the graphene forming unit.

13. The coating apparatus of claim 9, wherein the chamber for the graphene forming unit includes a temperature controllable heating source.

14. The coating apparatus of claim 1, wherein the first roller, the pre-treating unit, the graphene forming unit, and the second roller are vertically or horizontally arranged, in order.

15. The coating apparatus of claim 1, wherein the pre-treating unit and the graphene forming unit have tube shapes and are arranged so as to communicate with each other.

16. The coating apparatus of claim 15, further comprising:
    a first gas inlet formed between the first roller and the pre-treating unit; and
    a second gas inlet formed between the pre-treating unit and the graphene forming unit.

* * * * *